(12) United States Patent
Jiang

(10) Patent No.: US 11,574,854 B2
(45) Date of Patent: Feb. 7, 2023

(54) DISTRIBUTED INDUCTANCE INTEGRATED FIELD EFFECT TRANSISTOR STRUCTURE

(71) Applicant: NATIONAL RESEARCH COUNCIL OF CANADA, Ottawa (CA)

(72) Inventor: Nianhua (Frank) Jiang, Victoria (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 13 days.

(21) Appl. No.: 17/224,762

(22) Filed: Apr. 7, 2021

(65) Prior Publication Data
US 2021/0320053 A1    Oct. 14, 2021

Related U.S. Application Data

(60) Provisional application No. 63/006,906, filed on Apr. 8, 2020.

(51) Int. Cl.
*H01L 49/02* (2006.01)
*H01L 23/482* (2006.01)
(Continued)

(52) U.S. Cl.
CPC .......... *H01L 23/4821* (2013.01); *H01L 23/50* (2013.01); *H01L 23/66* (2013.01);
(Continued)

(58) Field of Classification Search
CPC ... H01L 27/0288; H01L 27/088; H01L 27/10; H01L 27/105; H01L 29/08; H01L 29/0843; H01L 29/0847; H01L 29/0865; H01L 29/0869; H01L 29/0882; H01L 29/0886; H01L 29/78; H01L 29/7803; H01L 28/10; H01L 25/16; H01L 25/18; H01L 23/4821; H01L 23/50; H01L 23/66; H01L 24/48; H01L 27/085; H01L 2223/6627;
(Continued)

(56) References Cited

U.S. PATENT DOCUMENTS

| 4,359,754 A | 11/1982 | Hayakawa et al. |
| 5,966,520 A * | 10/1999 | Buer ...................... H03F 3/211 |
| | | 438/10 |

(Continued)

OTHER PUBLICATIONS

Chiong, Chau-Ching, et al. "180-220 GHz MMIC amplifier using 70-nm GaAs MHEMT technology." 2016 IEEE International Symposium on Radio-Frequency Integration Technology (RFIT). IEEE, 2016.
(Continued)

*Primary Examiner* — Eduardo A Rodela
(74) *Attorney, Agent, or Firm* — Perry + Currier Inc.; Stephen J. Perry

(57) ABSTRACT

A distributed inductance integrated field effect transistor (FET) structure, comprising a plurality of FETs. Each FET comprises a plurality of source regions, a gate region having a plurality of gate fingers extending from a gate bus bar, a drain region having a plurality of drain finger extending from a drain bus bar between the plurality of gate fingers, wherein the gate region controls current flow in a conductive channel between the drain region and source region. A first distributed inductor connects the gate regions of adjacent ones of the plurality of FETs; and a second distributed inductor connects the drain regions of adjacent ones of the plurality of FETs.

12 Claims, 11 Drawing Sheets

(51) Int. Cl.
  *H01L 27/085* (2006.01)
  *H01L 23/00* (2006.01)
  *H01L 23/50* (2006.01)
  *H01L 23/66* (2006.01)
  *H01L 29/08* (2006.01)
  *H01L 25/16* (2023.01)

(52) U.S. Cl.
  CPC .............. *H01L 24/48* (2013.01); *H01L 25/16* (2013.01); *H01L 27/085* (2013.01); *H01L 28/10* (2013.01); *H01L 29/0843* (2013.01); *H01L 2223/6627* (2013.01); *H01L 2224/4813* (2013.01); *H01L 2924/1306* (2013.01); *H01L 2924/19032* (2013.01); *H01L 2924/30105* (2013.01)

(58) Field of Classification Search
  CPC ..... H01L 2224/4813; H01L 2924/1306; H01L 2924/19032; H01L 2924/30105
  See application file for complete search history.

(56) References Cited

U.S. PATENT DOCUMENTS

| | | | |
|---|---|---|---|
| 6,765,268 B2 | 7/2004 | Akamine et al. | |
| 8,097,906 B2 | 1/2012 | Takagi | |
| 8,373,231 B2* | 2/2013 | Yamamoto | H01L 29/41758 |
| | | | 257/357 |
| 9,685,438 B2* | 6/2017 | Laighton | H01L 29/42316 |
| 9,786,660 B1 | 10/2017 | Farrell et al. | |
| 10,170,400 B2 | 1/2019 | Imai et al. | |
| 10,594,276 B2* | 3/2020 | Jones | H01L 29/41758 |
| 2003/0151114 A1* | 8/2003 | Zyl | H01L 25/072 |
| | | | 257/E25.016 |
| 2008/0061325 A1* | 3/2008 | Schmidt | H01L 29/1066 |
| | | | 257/E21.445 |
| 2011/0233677 A1* | 9/2011 | Yamamoto | H01L 27/027 |
| | | | 257/E27.06 |
| 2012/0086497 A1* | 4/2012 | Vorhaus | H03F 3/604 |
| | | | 257/E29.089 |
| 2014/0175514 A1* | 6/2014 | Darwish | H01L 29/42316 |
| | | | 257/401 |
| 2014/0252416 A1* | 9/2014 | Takagi | H01L 29/7786 |
| | | | 257/194 |
| 2014/0367789 A1* | 12/2014 | Chen | H01L 29/0692 |
| | | | 257/369 |
| 2017/0301766 A1* | 10/2017 | Ichijoh | H01L 29/42316 |
| 2018/0197999 A1* | 7/2018 | Palacios | H01L 21/8252 |
| 2020/0118922 A1* | 4/2020 | Hill | H01L 23/481 |
| 2020/0343352 A1* | 10/2020 | Trang | H01L 23/552 |

OTHER PUBLICATIONS

Smith, P. M., et al. "W-band high efficiency InP-based power HEMT with 600 GHz f max." IEEE Microwave and Guided Wave Letters 5.7 (1995): 230-232.

* cited by examiner

DISTRIBUTED INDUCTANCE INTEGRATED FIELD EFFECT TRANSISTOR STRUCTURE

BACKGROUND OF THE INVENTION

1. Field of the Invention

The present invention is directed to field effect transistors, and in particular to an integrated field effect transistor structure with distributed inductance.

2. Description of the Related Art

A field-effect transistor (FET) is a type of transistor that is used in modern electronics and radiofrequency (RF) technology, wherein an electric field is used to control the flow of current. FETs are devices with three terminals: source, gate, and drain. When used as an amplifier, the gate is most often configured as the input terminal, the source is grounded, and the drain is the output. FETs control the flow of current by the application of a voltage signal to the gate, which in turn alters the conductivity of the channel between drain and source. The source connection is the "source" of electrons in the channel, and the drain is where the electrons are "drained off". This configuration is called common source since the source is common to the input and output ground connections. In one variety of FET, the gate conductor has a plurality of fingers (gate fingers) disposed between alternating source and drain regions of a substrate to increase the drive current.

Improvements in FET performance continue to lower noise generation and to push RF technology to higher frequencies (e.g. into the millimeter-wave and submillimeter-wave ranges). However, conventional transistor designs, which are based on a legacy of low-frequency design approaches, are limited by gain roll-off when operated at high-frequencies. In particular, FET input and output capacitors limit the performance at higher frequencies, as described for example in: "Broadband Microwave Amplifiers", Virdee, Virdee, and Banyamin, Artech House Publishers, 2004; Chiang, Chen, Kao, Wang, and Chen, "180-220 GHz MMIC amplifier using 70-nm GaAs MHEMT technology", IEEE Int. Symp. Radio-Frequency Integ. Tech., DOI: 10.1109/RFIT.2016.7578199, 2016; and Smith, Liu, Kao, Ho, Wang, Duh, Fu, and Chao, "W-band high efficiency InP-based power HEMT with 600 GHz $f_{max}$", IEEE Micro. Guided Waves Lett., 5, pp. 230-232, 1995.

For conventional FETs, the gain-frequency performance is strongly dependent on the gate-to-source capacitance Cgs, gate-to-drain capacitance Cgs, and the drain-to source capacitance Cds, all of which are proportional to the total gate width. Cgs causes input signal loss and significantly reduces the transistor transconductance (voltage-to-current gain); Cgd results in signal leakage from gate to drain and feedback from drain to gate, which results in a drop in gain at high frequency; while a larger Cds draws away output current. Since the corresponding susceptances jωCgs, jωCgd, and jωCds increase with frequency these performance limitations become more severe as the operating frequency increases, limiting the overall performance of FETs at high frequencies.

Typically, sustaining FET performance at high frequencies is achieved by decreasing the transistor size and using fewer gate fingers, resulting in slower gain roll-off. However, smaller-size FETs with fewer-fingers are subject to performance limitations in terms of lower gain and RE power capacity, which is a significant drawback since gain is a key performance parameter for transistor-based amplifiers, particularly for low noise amplifiers where high gain is critical for achieving optimal noise performance. It is therefore a challenge to design high-gain low noise amplifiers capable of operating at high frequencies (i.e. above approximately 50 GHz) using conventional transistor design methodologies.

SUMMARY OF THE INVENTION

It is an aspect of the present invention to provide a FET structure that is characterized by improved gain-frequency performance through the use of distributed inductance integrated with the gate fingers, for applications such as radio astronomy receiver systems and high-frequency RF detector/sensor systems.

The above aspects can be attained by a system that improves the transistor gain-frequency performance by introducing a distributed inductance between a plurality of gate-fingers and a plurality of drain-fingers respectively, and decoupling the deleterious effects of multi-gate capacitance, multi-gate-to-drain capacitance, and multi-drain capacitance.

According to an aspect of this specification a distributed inductance integrated field effect transistor (FET) structure is set forth, comprising: a plurality of FETs, each FET comprising a plurality of source regions, a gate region having a plurality of gate fingers extending from a gate bus bar, and a drain region having a plurality of drain finger extending from a drain bus bar between the plurality of gate fingers, wherein the gate region controls current flow in a conductive channel between the drain region and source region; a first distributed inductor connecting the gate regions of adjacent ones of the plurality of FETs; and a second distributed inductor connecting the drain regions of adjacent ones of the plurality of FETs.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1A:
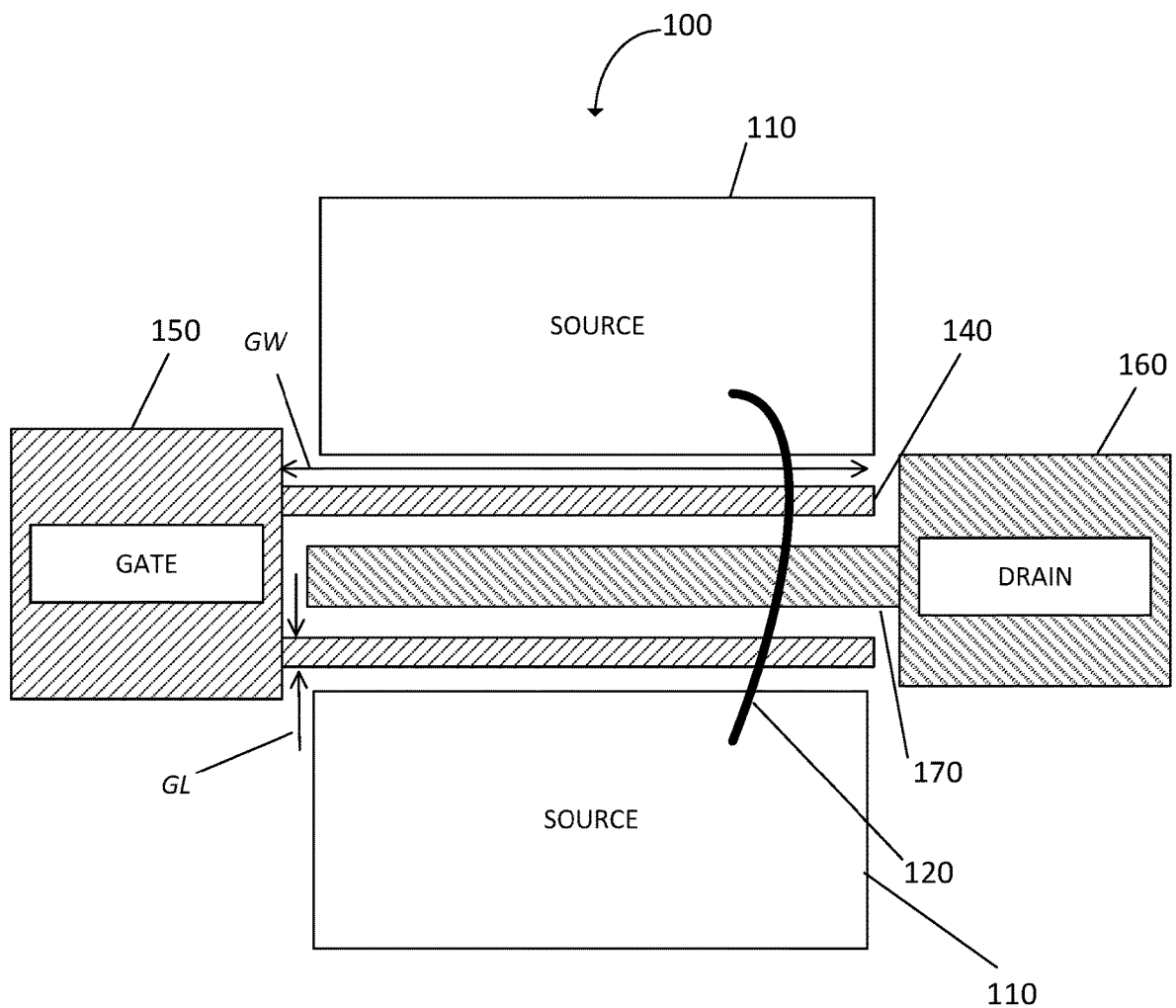
FIGS. 1A and 1B show embodiments of a conventional FET with a two-finger gate.
Figure 1B:
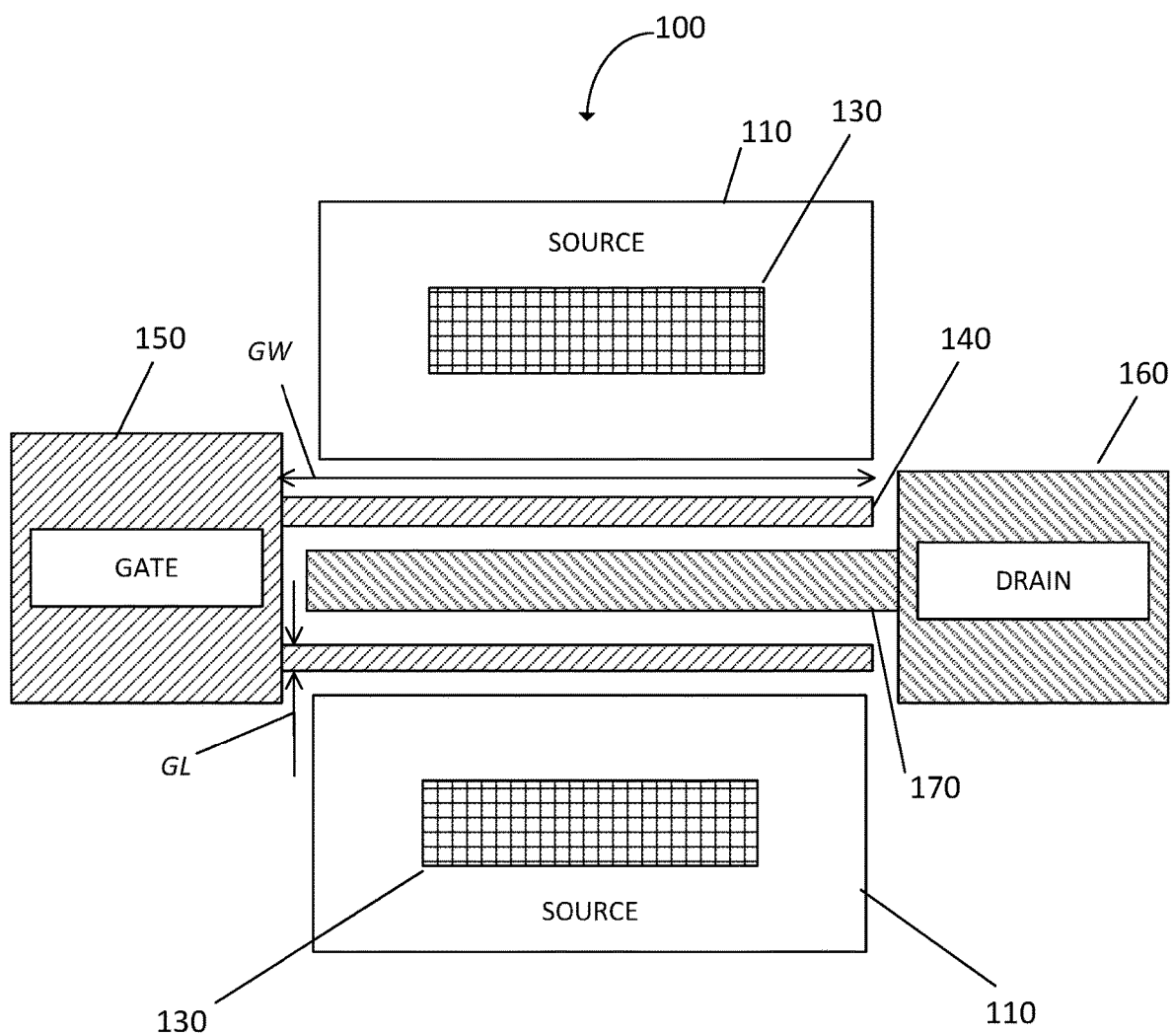

As discussed above, multi-finger FETs are known wherein the gate conductor has a plurality of fingers disposed between alternating source and drain regions of a substrate, to increase the drive current. Examples of a two-finger FET 100 are shown in FIGS. 1A and 1B. In the embodiment of FIG. 1A, source regions 110 are connected by an air bridge 120, and gate fingers 140 are disposed between alternating source and drain regions. A gate bus bar 150 connects the multiple gate fingers 140 together, and a drain bus bar 160 connects multiple drain fingers 170 together.

In the embodiment of FIG. 1B, source regions 110 are connected by source ground holes 130 (or simply, "vias") to the chip backside metal, which acts as RF and DC ground. Vias 130 provide very low-inductance grounding to the source 110, leading to high gain and efficiency for power amplifiers, which is important for power FETs operating at millimeter-wave frequencies. However, on larger FET substrates, the use of vias 130 is not usually possible because the source contact pad is typically smaller than the minimum diameter of the etched via 130. In this case, the source-overlay air bridge 120 of FIG. 1A may be used for connecting the source regions 110 to a grounding pad (not shown).

Figure 2A:
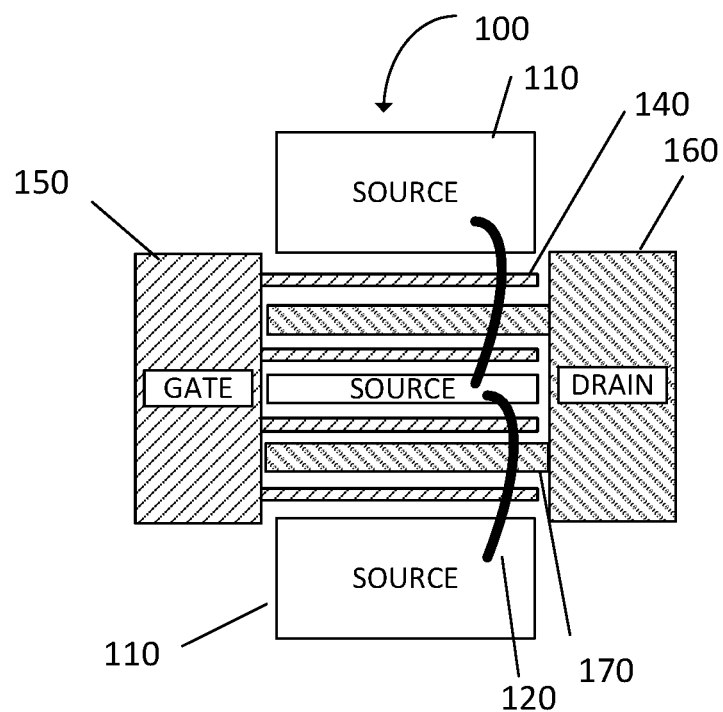
FIGS. 2A and 2B show embodiments of a conventional FET with a four-finger gate.
Figure 2B:
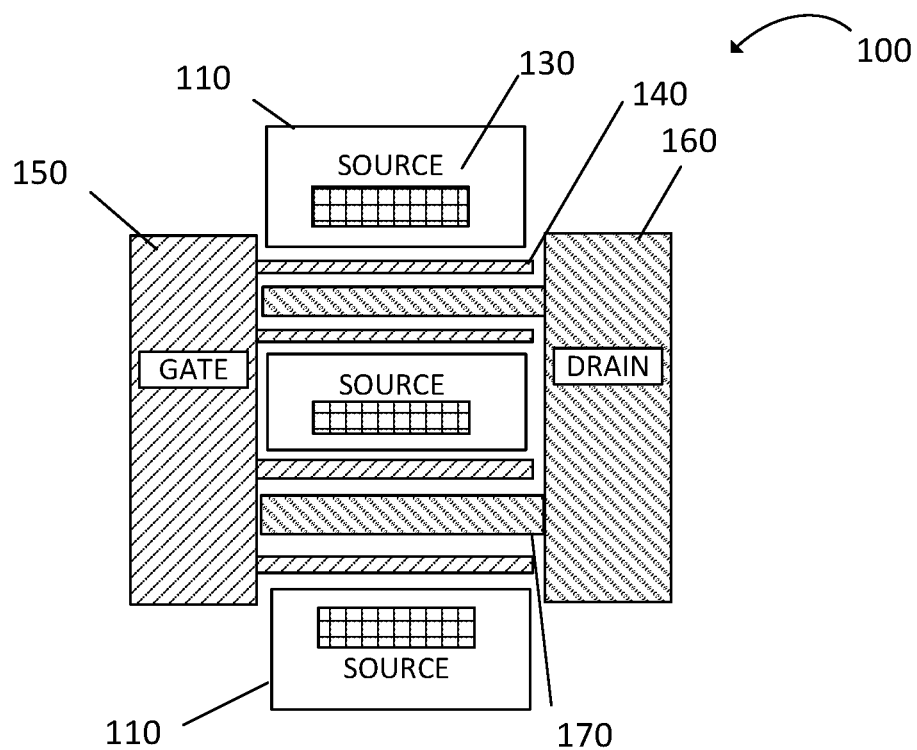

FIG. 2A shows a four-finger FET with air bridges 120 similar to the embodiment of FIG. 1A, while FIG. 2B shows a four-finger FET with vias 130 similar to the embodiment of FIG. 1B.

The gate width GW is the unit width of a gate finger 140 as it passes between adjacent source region 110 and drain finger 170. A larger GW results in greater DC and RF current, and therefore more power capability. Gate width GW must be sized appropriate to the operating frequency: if GW becomes an appreciable fraction of wavelength, the RF performance of the FET suffers. At X-band, power FETs often have 150 um wide gates. At Ka-band the GW is typically 75 micron maximum. At W-band, a GW of 40 microns is a typical upper limit.

Figure 3:
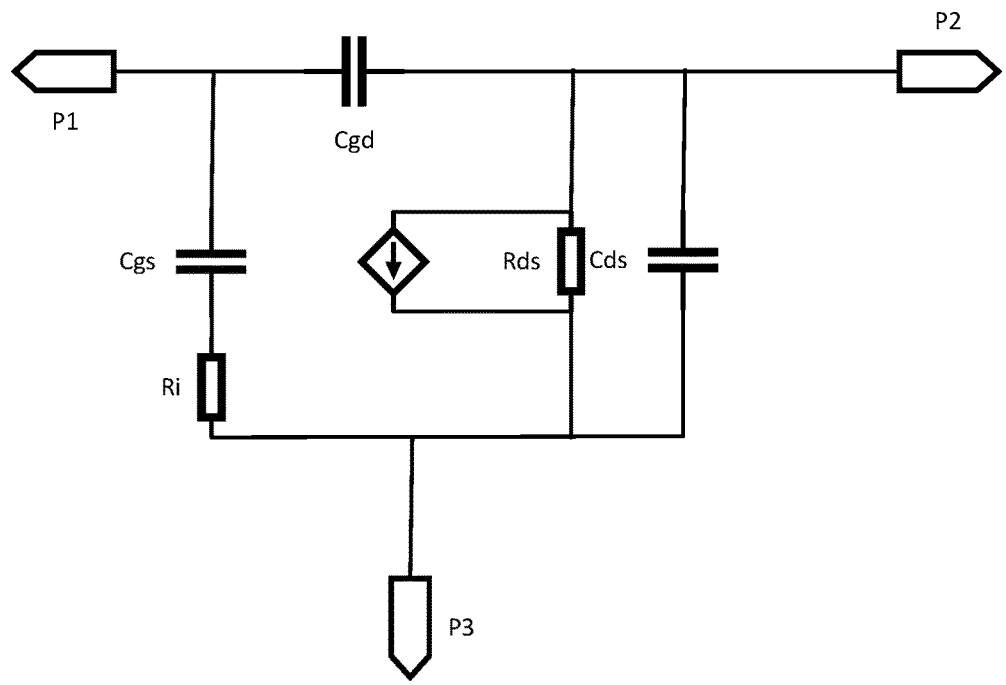
FIG. 3 is a circuit diagram illustrating a linear model of a conventional FET.

With reference to the linear model of FIG. 3, Cgs represents the gate-to-source capacitance, Cgd denotes the gate-to-drain capacitance, and Cds is the drain-to-source capacitance of a conventional FET, wherein all of Cgs, Cgd, and Cds are proportion to the total gate width GW. The susceptances of $j\omega Cgs$, $j\omega Cgd$, and $j\omega Cds$ increase with frequency. Cgs causes input signal loss and significantly reduces the transistor transconductance (voltage to current gain) as frequency increases. Cgd results in signal leakage from gate to drain and feedback from drain to gate, which causes a further decline in gain at high frequencies. Larger Cds also draws away more output current.

Figure 4:
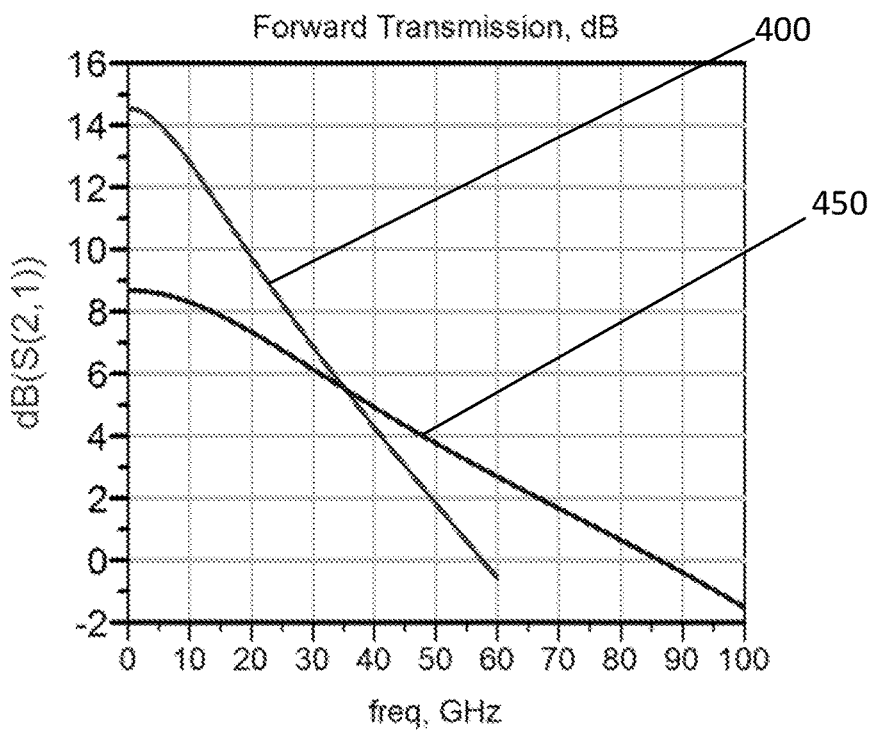
FIG. 4 is a graph of gain vs. frequency for two-finger and four-finger gate conventional FET.

As discussed above, maintenance of FET performance at higher frequencies can achieved by decreasing the transistor size and using fewer gate fingers 140. In FIG. 4, 300 shows the gain of a 4-finger transistor, such as shown in FIGS. 2A and 2B, which is characterized by high gain at low frequencies, but which decreases ("rolls-off") quickly as the frequency increases. The curve 450 shows the gain of a smaller transistor with two fingers, such as shown in FIGS. 1A and 1B, which is small gain at low frequencies, but the gain roll-off is slower such that the smaller 2-finger transistor performs better at higher frequencies. Thus, it is evident from FIG. 4 that reducing the transistor size for operation at higher frequencies results in gain loss, which is a key parameter for amplifiers, especially for low noise amplifier. In low noise amplifier design, high gain is important for achieving best noise performance.

Therefore, according to an aspect of the invention, the transistor gain-frequency performance is improved by introducing a distributed inductance that is integrated with the gate-fingers 140 to decouple the deleterious effects of multi-gate capacitance, multi-gate-to-drain capacitance, and multi-drain capacitance.

Figure 5:
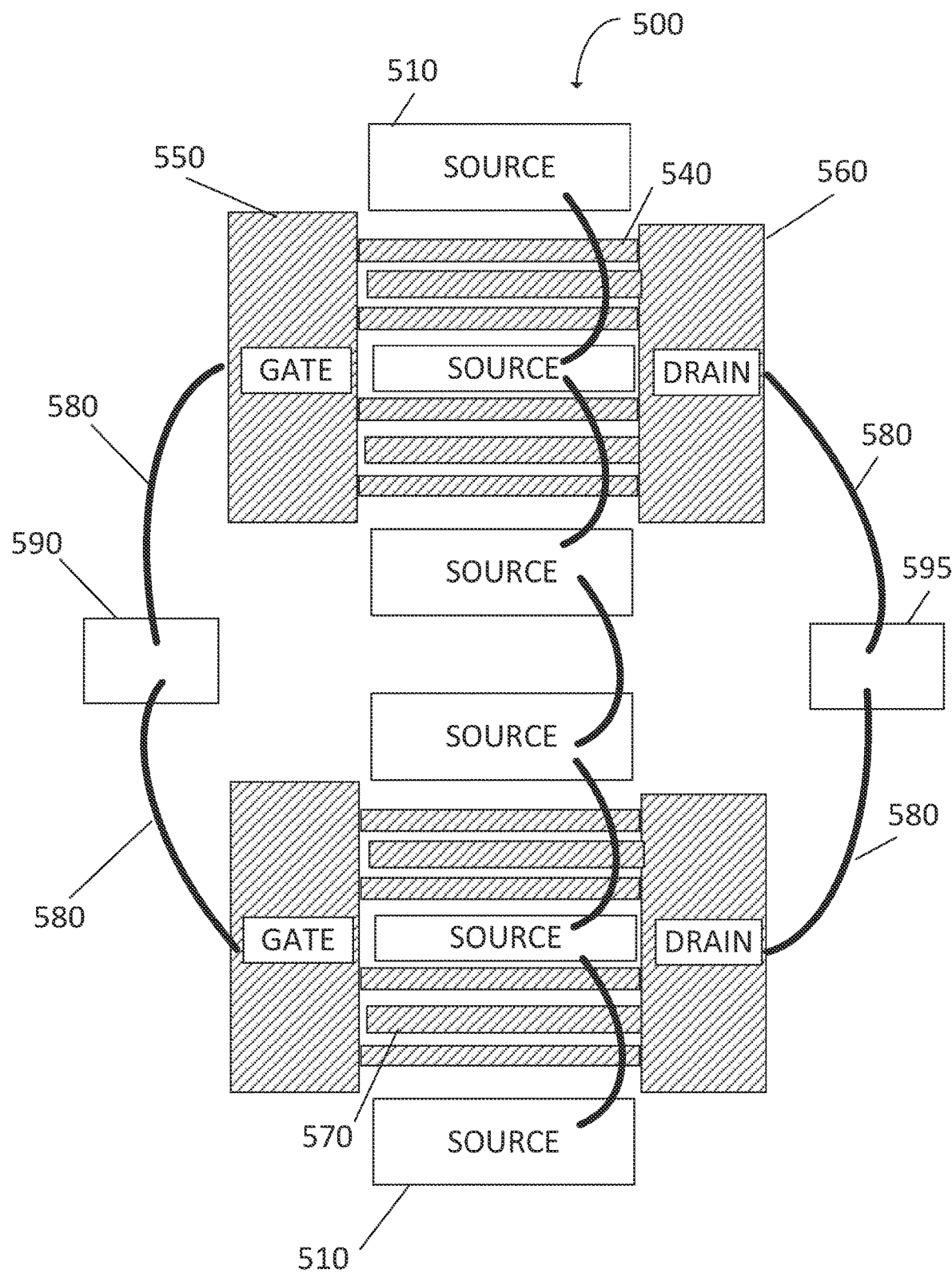
FIG. 5 shows two discrete FETs integrated with distributed inductance of bonded gold wires, according to an embodiment.
Figure 6:
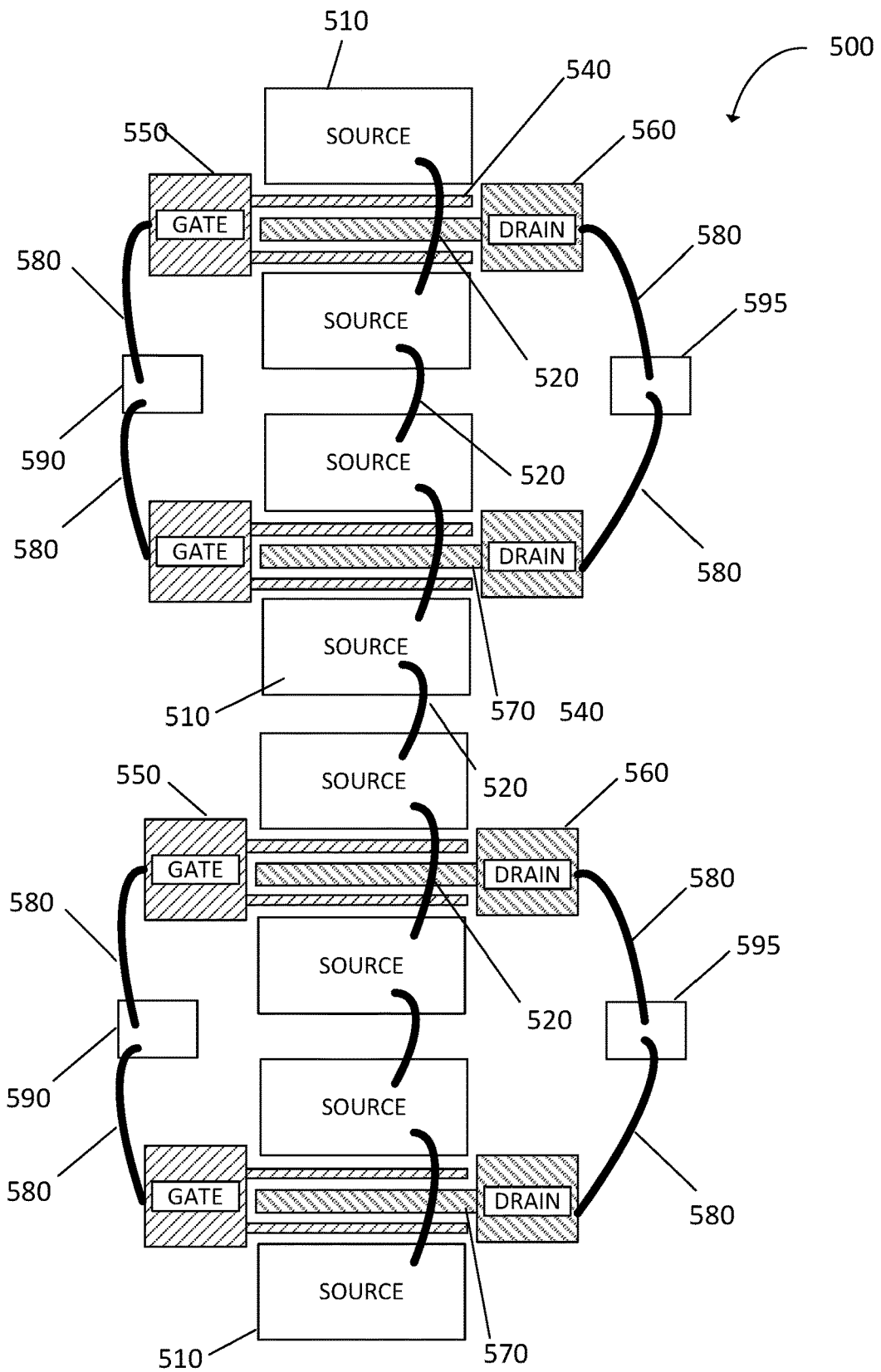
FIG. 6 shows the structure of FIG. 5 repeated to integrate additional transistors in parallel, according to an embodiment.

Turning to FIG. 5, two discrete FETs are integrated into a combined structure 500 via bonding wires 580 (e.g. bonded gold wires) that act as with distributed inductors, thereby doubling the transistor size and gain while the frequency response is similar like that of a single transistor. FIG. 6 shows the structure of FIG. 5 repeated to create additional transistors integrated in parallel for increased gain.

In FIGS. 5 and 6, source regions 510 are connected by an air bridge 520. Gate fingers 540 are disposed between alternating source and drain regions. A gate bus bar 550 connects the multiple gate fingers 540 together, and a drain bus bar 560 connects multiple drain fingers 570 together. The bonding wires 580 connect the gate bus bars 550 to a gate driver 590 and the drain bus bars 560 to a drain driver 595.

Figure 7:
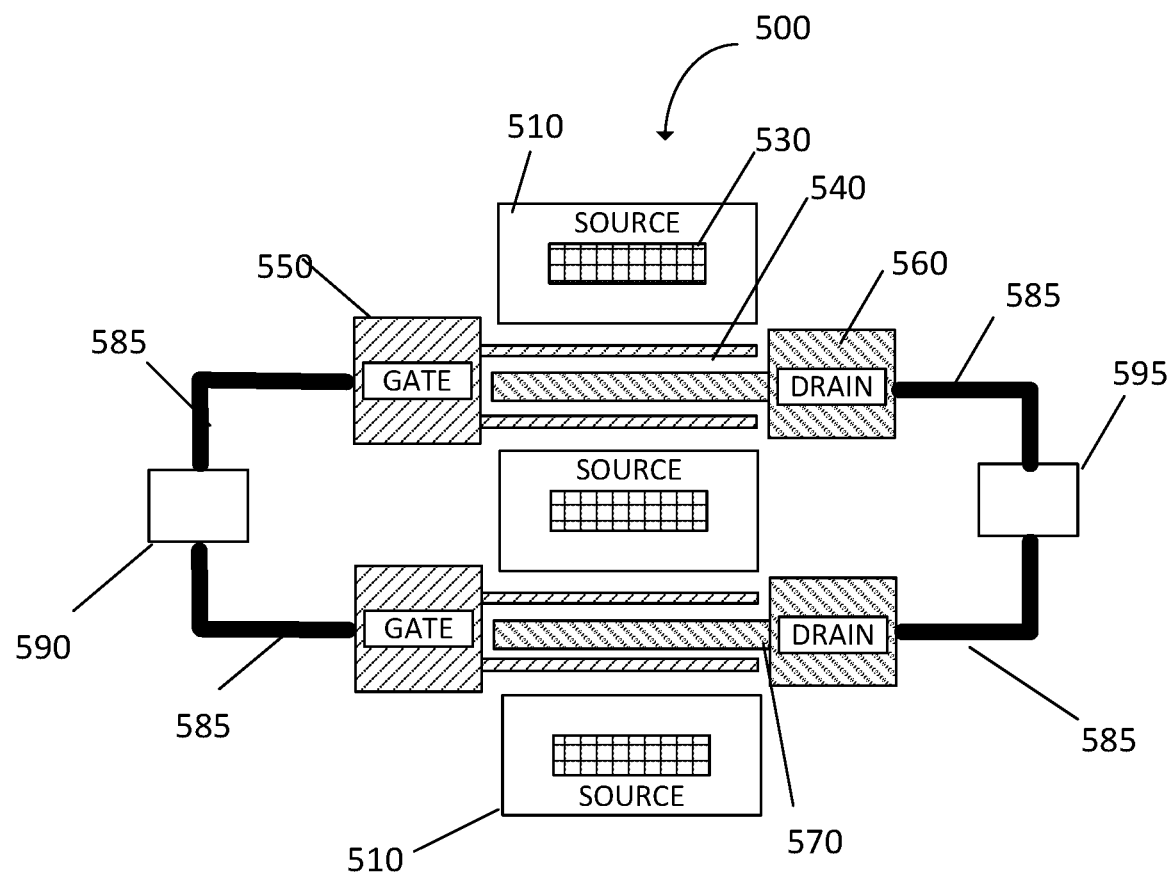
FIG. 7 shows two FETs layout incorporating a via as source ground and integrated with distributed inductance of microstripline sections, according to an embodiment.
Figure 8:
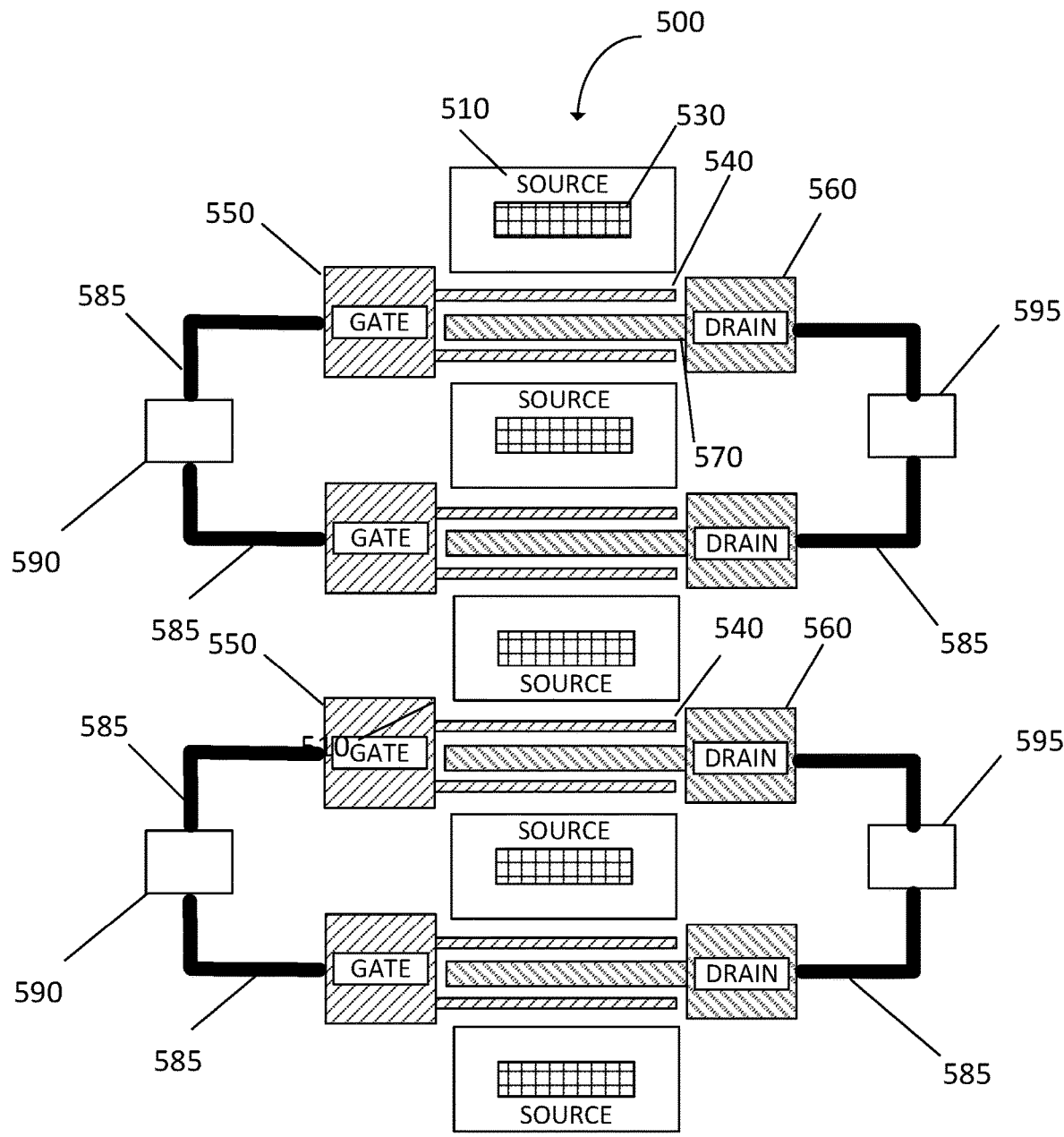
FIG. 8 shows the structure of FIG. 7 repeated to integrate additional transistors in parallel, according to an embodiment.

The embodiment of FIG. 7 shows a transistor layout for integrated circuits, wherein source regions 510 are connected by source ground vias 530 to the chip backside metal, which acts as RF and DC ground, and the distributed inductance is provided by microstripline sections 585. The structure of FIG. 7 can be repeated as shown in FIG. 8 to integrate additional transistors in parallel, forming high gain monolithic microwave integrated circuits (MMICs).

Figure 9:
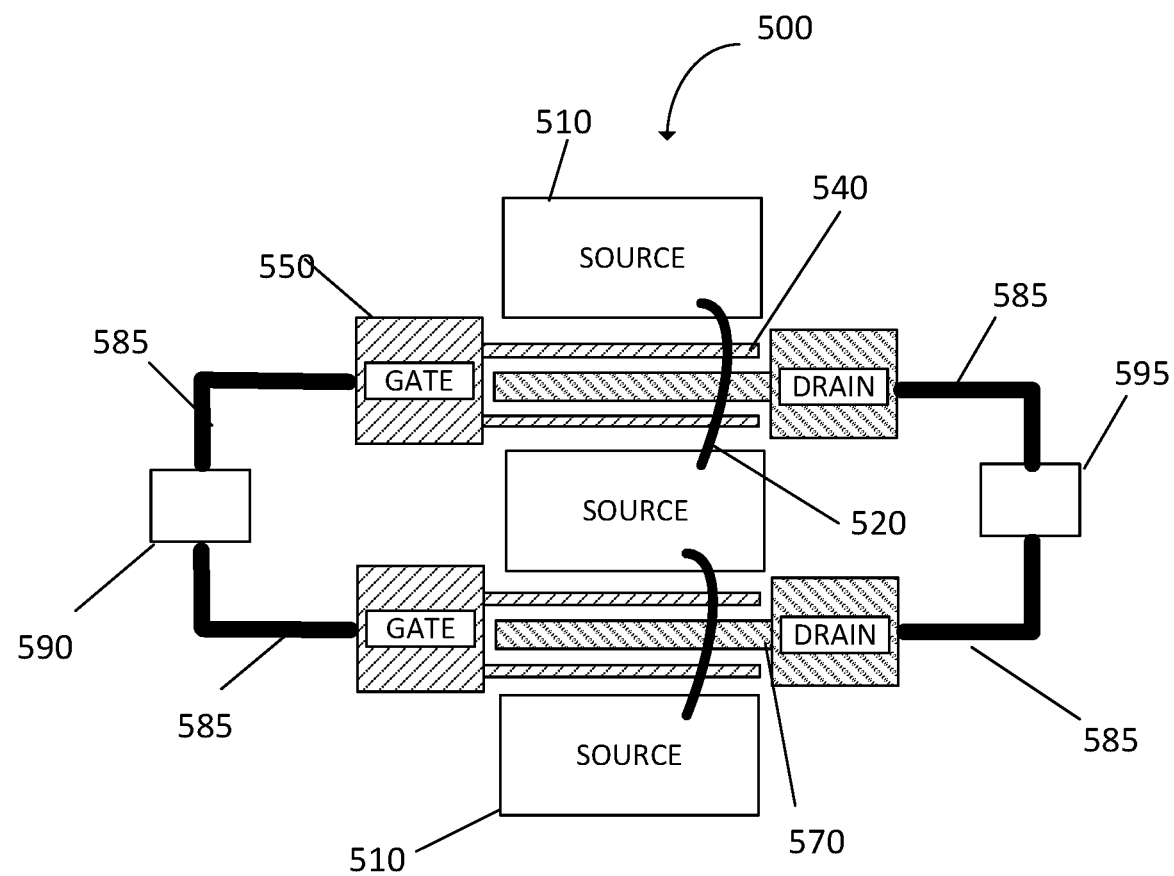
FIG. 9 shows two FETs layout incorporating an air-bridge for source connection and integrated with distributed inductance of microstripline sections, according to an embodiment.
Figure 10:
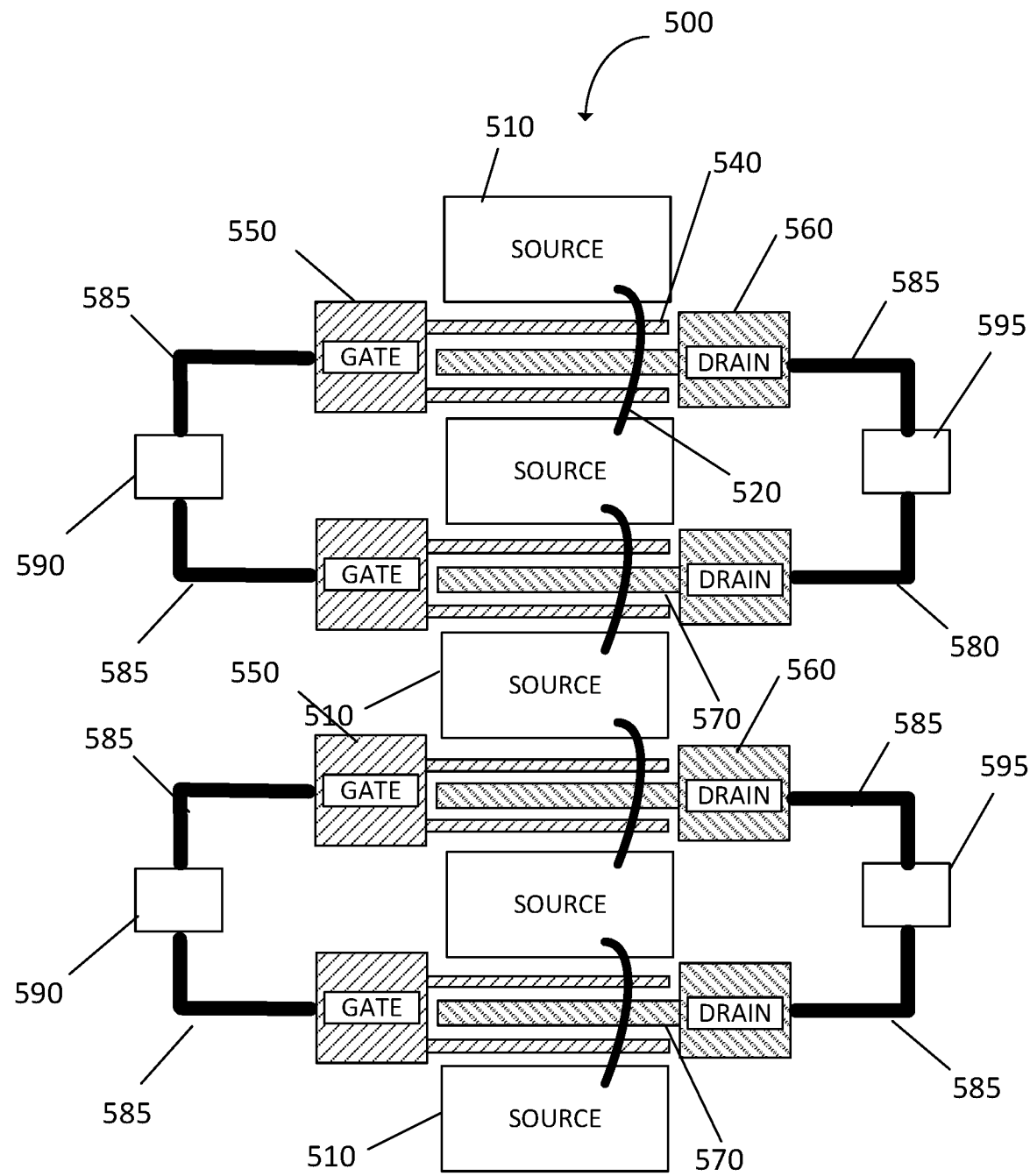
FIG. 10 shows the structure of FIG. 9 repeated to integrate additional transistors in parallel, according to an embodiment.

In the embodiment of FIG. 9, the structure of FIG. 7 is replicated except that the vias 530 for source ground are replaced by air bridges 520. The structure of FIG. 9 can be repeated as shown in FIG. 10 to integrate additional transistors in parallel, forming high gain monolithic microwave integrated circuits (MMICs).

The FET structures set forth in FIGS. 5-10 provide improved transistor gain-frequency performance over conventional FETs by coupling a plurality of smaller two-finger FETs through the use of distributed inductance integrated with the gate fingers 540. The FET structures set forth in FIGS. 5-10 are characterized by a slow gain roll-off at high frequencies while simultaneously boosting the overall magnitude of the gain and RF power capacity.

The FET structures set forth in FIGS. 5-10 effectively decouple the multi-gate capacitor effect, multi-gate-to-drain capacitor effect, and multi-drain capacitor effect by distributing the inductance at gate and drain, resulting in improved high frequency performance, such as extending amplifier operating frequency range, increasing gain, lowering noise, and enhancing RF power capacity.

The FET structures set forth herein have wide applicability in commercial applications in transistor-based electronic devices requiring high gain at high frequencies, lower noise and higher RF power capacity.

The many features and advantages of the invention are apparent from the detailed specification and, thus, it is intended by the appended claims to cover all such features and advantages of the invention that fall within the scope of the claims. Further, since numerous modifications and changes will readily occur to those skilled in the art, it is not desired to limit the invention to the exact construction and operation illustrated and described, and accordingly all suitable modifications and equivalents may be resorted to, falling within the scope of the claims.

What is claimed is:

1. A distributed inductance integrated field effect transistor (FET) structure, comprising:
   a plurality of FETs, each FET comprising
   a plurality of source regions,
   a gate region having a plurality of gate fingers extending from a gate bus bar,
   a drain region having a plurality of drain fingers extending from a drain bus bar between the plurality of gate fingers, wherein the gate region controls current flow in a conductive channel between the drain region and source region;
   a first distributed inductor connecting the gate regions of adjacent ones of the plurality of FETs; and
   a second distributed inductor connecting the drain regions of adjacent ones of the plurality of FETs.

2. The distributed inductance integrated field effect transistor (FET) structure according to claim 1, wherein the first distributed inductor comprises a plurality of bonding wires.

3. The distributed inductance integrated field effect transistor (FET) structure according to claim 2, wherein the bonding wires connect each said gate bus bar to a gate driver.

4. The distributed inductance integrated field effect transistor (FET) structure according to claim 1, wherein the second distributed inductor comprises a plurality of bonding wires.

5. The distributed inductance integrated field effect transistor (FET) structure according to claim 4, wherein the bonding wires connect each said drain bus bar to a drain driver.

6. The distributed inductance integrated field effect transistor (FET) structure according to claim 1, wherein the first distributed inductor comprises a plurality of microstripline sections.

7. The distributed inductance integrated field effect transistor (FET) structure according to claim 6, wherein the microstripline sections connect each said gate bus bar to a gate driver.

8. The distributed inductance integrated field effect transistor (FET) structure according to claim 1, wherein the second distributed inductor comprises a plurality of microstripline sections.

9. The distributed inductance integrated field effect transistor (FET) structure according to claim 8, wherein the microstripline sections connect each said drain bus bar to a drain driver.

10. The distributed inductance integrated field effect transistor (FET) structure according to claim 1, wherein the plurality of FETs are integrated in parallel.

11. The distributed inductance integrated field effect transistor (FET) structure according to claim 1, wherein adjacent source regions are connected by an air bridge.

12. The distributed inductance integrated field effect transistor (FET) structure according to claim 1, wherein adjacent source regions are connected by source ground vias.

* * * * *